United States Patent
Occhionero (10) Patent No.: US 10,462,940 B2
(45) Date of Patent: Oct. 29, 2019

(54) THERMAL MANAGEMENT DEVICE FOR HEAT GENERATING POWER ELECTRONICS INCORPORATING HIGH THERMAL CONDUCTIVITY PYROLYTIC GRAPHITE AND COOLING TUBES

(71) Applicant: Mark Occhionero, Plymouth, MA (US)

(72) Inventor: Mark Occhionero, Plymouth, MA (US)

(73) Assignee: CPS Technologies, Norton, MA (US)

( * ) Notice: Subject to any disclaimer, the term of this patent is extended or adjusted under 35 U.S.C. 154(b) by 220 days.

(21) Appl. No.: 15/644,658

(22) Filed: Jul. 7, 2017

(65) Prior Publication Data

US 2018/0014435 A1    Jan. 11, 2018

Related U.S. Application Data

(60) Provisional application No. 62/493,555, filed on Jul. 8, 2016.

(51) Int. Cl.
| | |
|---|---|
| H05K 7/20 | (2006.01) |
| F28F 21/02 | (2006.01) |
| H01L 23/473 | (2006.01) |
| H01L 23/373 | (2006.01) |
| F28F 21/08 | (2006.01) |
| F28D 15/00 | (2006.01) |

(52) U.S. Cl.
CPC ......... *H05K 7/20927* (2013.01); *F28D 15/00* (2013.01); *F28F 21/02* (2013.01); *F28F 21/081* (2013.01); *H01L 23/373* (2013.01); *H01L 23/3731* (2013.01); *H01L 23/3736* (2013.01); *H01L 23/473* (2013.01)

(58) Field of Classification Search
CPC ............................ F28F 21/02; H05K 7/20927
See application file for complete search history.

(56) References Cited

U.S. PATENT DOCUMENTS

| | | | | |
|---|---|---|---|---|
| 5,978,220 A * | 11/1999 | Frey | ...................... | H01L 23/473 165/80.4 |
| 6,075,701 A * | 6/2000 | Ali | ...................... | H01L 23/3732 174/252 |
| 6,377,461 B1 * | 4/2002 | Ozmat | .................. | H01L 23/051 165/104.33 |
| 6,460,598 B1 * | 10/2002 | Adams | ............... | B22D 19/0072 164/30 |
| 7,141,310 B2 * | 11/2006 | Adams | ................ | H01L 23/3733 428/614 |
| 2003/0196825 A1 * | 10/2003 | Adams | ................ | H01L 23/3733 174/565 |
| 2006/0000591 A1 * | 1/2006 | Adams | ................ | H01L 23/3733 165/185 |
| 2008/0008216 A1 * | 1/2008 | Miller | ...................... | H01S 5/024 372/36 |

(Continued)

*Primary Examiner* — Robert J Hoffberg (57) ABSTRACT

The present invention is a system for cooling high power, heat generating devices. The system includes a metal matrix composite (AlSiC) having a coefficient of thermal expansion substantially equal to that of the heat generating device. The metal matrix composite (MMC) includes interior cooling channels and at least one Pyrolytic Graphite insert laterally positioned against the cooling channels. The heat generating device is placed on the metal matrix composite top surface in a substantially parallel relationship with the Pyrolytic Graphite insert surface area for maximum heat transfer efficiency.

4 Claims, 6 Drawing Sheets

(56) References Cited

U.S. PATENT DOCUMENTS

| | | | | |
|---|---|---|---|---|
| 2008/0085403 A1* | 4/2008 | Sayir | ............... | C09K 5/14 |
| | | | | 428/212 |
| 2008/0128067 A1* | 6/2008 | Sayir | ............... | C09K 5/14 |
| | | | | 156/60 |
| 2011/0259184 A1* | 10/2011 | Adams | ............ | B22D 19/02 |
| | | | | 89/36.02 |
| 2014/0140117 A1* | 5/2014 | Ishibashi | ......... | H05K 7/20927 |
| | | | | 363/141 |
| 2016/0150678 A1* | 5/2016 | Kim | ............ | H01L 23/3738 |
| | | | | 361/699 |
| 2016/0192539 A1* | 6/2016 | Sugita | .......... | H05K 7/20927 |
| | | | | 361/699 |
| 2017/0115073 A1* | 4/2017 | Knox | ............ | F28F 13/18 |

* cited by examiner

THERMAL MANAGEMENT DEVICE FOR HEAT GENERATING POWER ELECTRONICS INCORPORATING HIGH THERMAL CONDUCTIVITY PYROLYTIC GRAPHITE AND COOLING TUBES

CROSS-REFERENCE TO RELATED APPLICATIONS

The present application is related to, claims the earliest available effective filing date(s) from (e.g., claims earliest available priority dates for other than provisional patent applications; claims benefits under 35 USC § 119(e) for provisional patent applications), and incorporates by reference in its entirety all subject matter of the following listed application(s) (the "Related Applications") to the extent such subject matter is not inconsistent herewith; the present application also claims the earliest available effective filing date(s) from, and also incorporates by reference in its entirety all subject matter of any and all parent, grandparent, great-grandparent, etc. applications of the Related Application(s) to the extent such subject matter is not inconsistent herewith:

U.S. provisional patent application 62/493,555 entitled "THERMAL RESISTANCE ALSIC POWER MODULE INTEGRATING HIGH THERMAL CONDUCTIVITY PYROLYTIC GRAPHITE AND COOLING TUBES, naming Mark A. Occhionero as inventor, filed Jul. 8, 2016.

FIELD OF THE INVENTION

The present invention relates to the thermal management and cooling of high heat generating electronics systems.

BACKGROUND OF THE INVENTION

Power electronics refers to the application of solid-state electronics related to the control and conversion of electrical power. This conversion is typically performed by Silicon, Silicon Carbide, and Gallium Nitride devices that are packaged into power modules. One of the factors associated with the power modules is that they tend to generate heat. While the heat generated by the device is due to many factors, it generally relates to the fact that the device efficiency is always less than 100%, and the efficiency loss typically becomes heat. Unfortunately, device performance tends to erode with increased temperatures and at certain temperature thresholds the device is destroyed.

An additional factor for thermal management relates to the packaging of a number of devices in small footprints. The power density at which the devices, and thus the module can operate, therefore depends on the ability to remove this generated heat. For many applications, including military and commercial aviation power electronics, the highest possible power density is needed.

The most common form of the thermal management of power electronics is by heat sinks. Heat sinks operate by transferring the heat away from the heat source thereby maintaining a lower temperature of the source. There are various types of heat sinks known in the thermal management field including air cooled and liquid cooled devices.

One example of the thermal management of a power module includes the attachment of a heat sink with embedded tubes to provide liquid cooling of the power module. The heat sink is typically a metallic structure, such as aluminum or copper. The tubes are generally metallic as well, with copper being the most common material. Some substance in liquid form, such as water, is passed through the tubes, and subsequently passes through the tubes in the structure. Typical tube outside diameters (ODs) are ½", ⅜", and occasionally as small as ¼". Due to turn radius and pressure limitations, there are usually no more than 4 to 6 tube passages per six-inch width.

The heat sink is typically coupled to the power module base with a thermal interface material (TIM) dispersed there-between. The thermal interface material may comprise thermal greases, compliant thermal pads, or the like. Although a relatively good thermal contact is accomplished, the thermal interface material has certain thermal resistance, which is disadvantageous to heat exchange between the heat sink and the heated surface. The thermal interface material is a better thermal conductor than air, but still tends to be the largest single component of thermal resistance between the heat source and the liquid cooling.

SUMMARY OF THE INVENTION

The present invention is a system for cooling high power, heat generating devices. The system includes a metal matrix composite (AlSiC) having a coefficient of thermal expansion substantially equal to that of the heat generating device. The metal matrix composite (MMC) includes interior cooling channels that have an inlet and outlet connected to a liquid source. The coolant channels confine the flow of liquid coolant within the MMC.

At least one Pyrolytic Graphite insert is positioned within the MMC interior volume, and the insert has a surface area bound by a plurality of peripheral edges. The peripheral edges of the Pyrolytic Graphite inserts are laterally positioned against the cooling channels. The heat generating device is positioned on the metal matrix composite top surface in a substantially parallel relationship with the Pyrolytic Graphite insert surface area for maximum heat transfer efficiency.

This structure optimizes thermal management by taking heat away from the devices and delivering it to a place where the heat can be dissipated (liquid cooling stream). Heat dissipation not only is a function of thermal conductivity but also a function of the thermal path, and the over all thermal resistance. In the present invention, the heat is taken away through the AlSiC material which incorporates high thermal conductivity pyrolytic graphite (hereafter HTC-PG) in a composite structure. The HTC-PG graphite spreads the heat to the embedded cooling tubes. The materials are incorporated in this composite structure with pressure assisted aluminum interfaces, therefore the thermal resistance between materials is minimized.

The thermal path in the present invention is minimized, and the over all thermal dissipation can be improved. The composite allows for materials and the cooling components to be more efficiently and effectively assembled to increase the overall thermal dissipation performance. It is also possible, that other structures, like the dielectric substrates, can also be incorporated in this composite structure to achieve a shorter thermal path, allowing for lower thermal resistance interfaces for additional thermal dissipation performance.

DETAILED DESCRIPTION OF THE INVENTION

Various embodiments of the present disclosure will be described herein with reference to the accompanying drawings. The invention relates generally to the cooling of high power electronics that require a high heat dissipation into a material that has a controlled thermal expansion coefficient, the material being compatible with the devices to mitigate thermal cycling induced stresses that can lead to failure.

Figure 1:
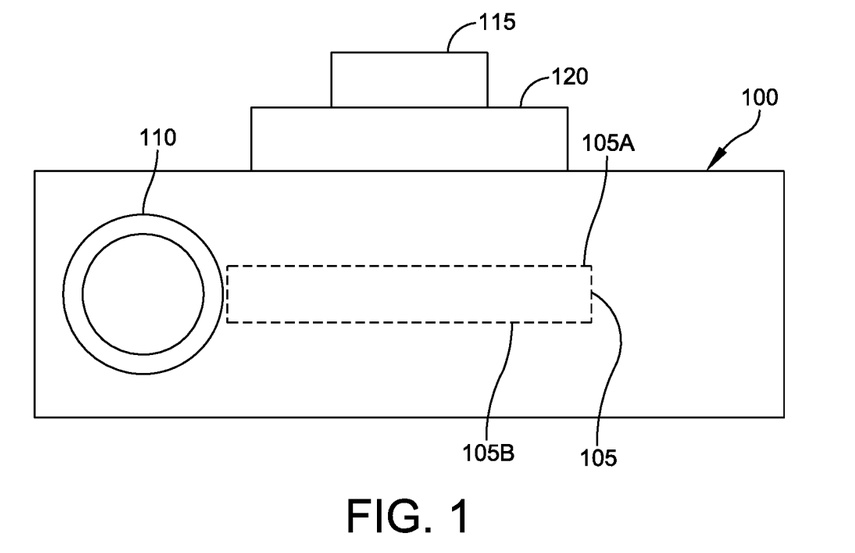
FIG. 1 illustrates a front view of the Thermal Management Device 100 of the present invention utilizing one cooling channel therein.
Figure 2:
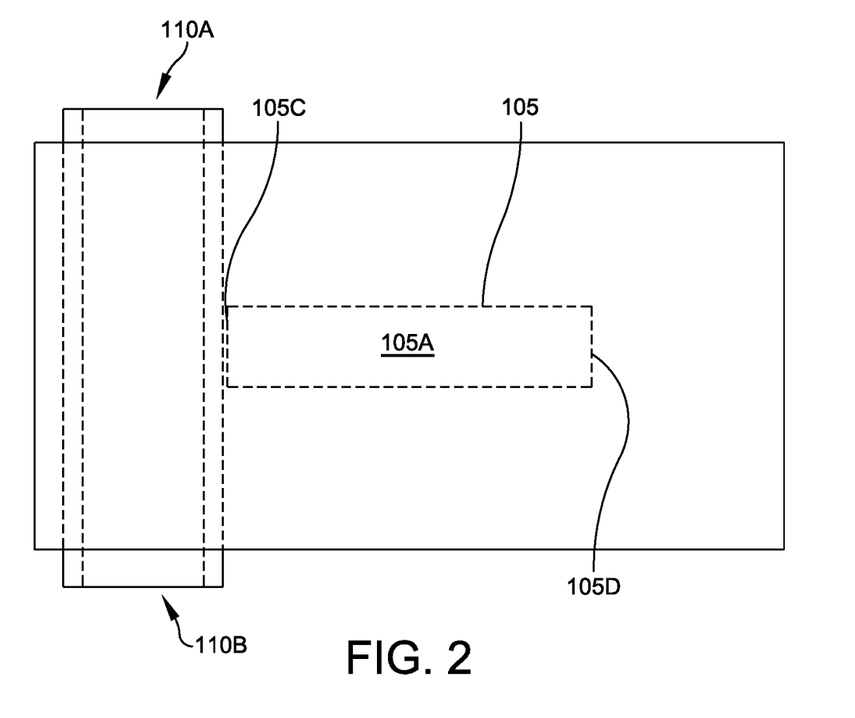
FIG. 2 illustrates a top view of FIG. 1.
Figure 3:
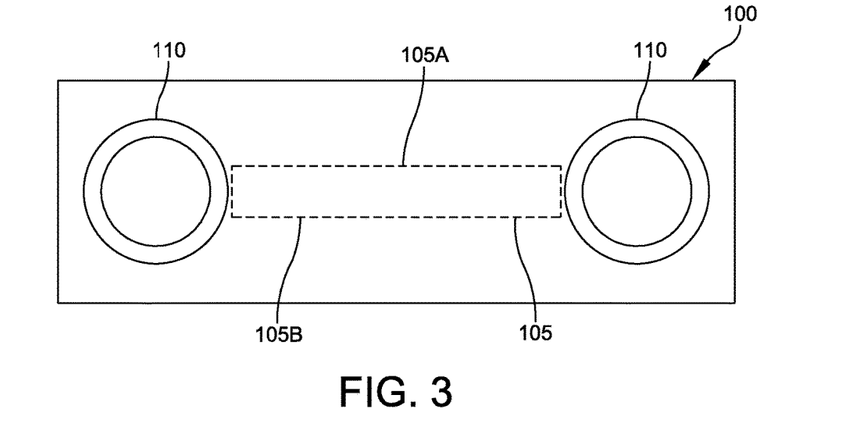
FIG. 3 illustrates the Thermal Management Device 100 of FIG. 1 utilizing two cooling channels therein.
Figure 4:
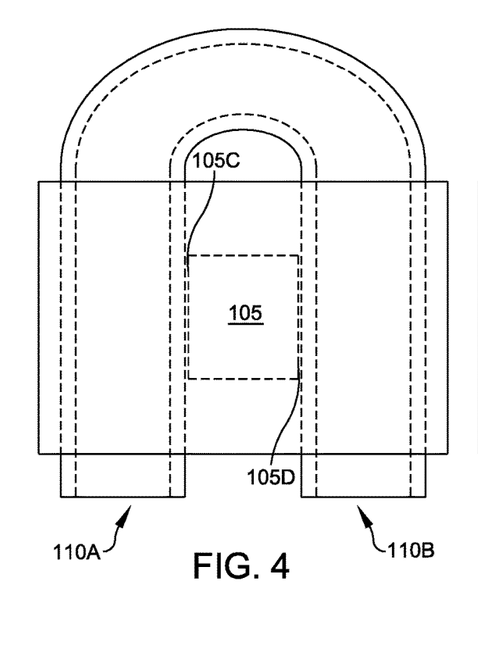
FIG. 4 illustrates a top view of the Thermal Management Device 100 of FIG. 3 with cooling channels connected externally to the ALSIC material.
Figure 5:
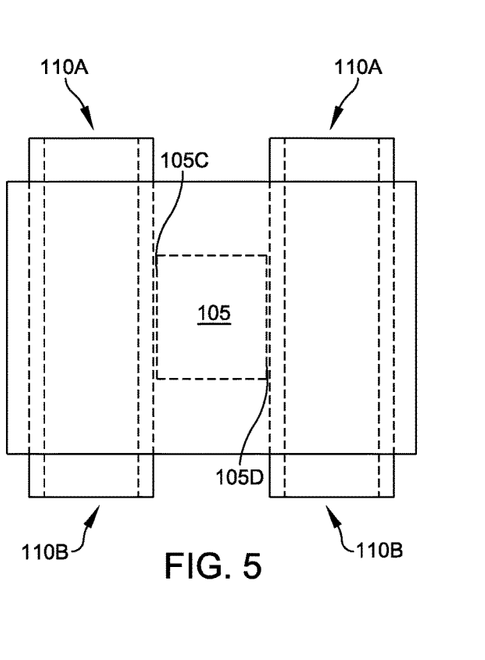
FIG. 5 illustrates a top view of the Thermal Management Device 100 of FIG. 3 with separate cooling channels.

Referring to FIGS. 1 and 2, a cross-section of a cooling device of the present invention is illustrated. In its most general embodiment it includes an AlSiC (Aluminum Silicon Carbide) base 100 integrating a HTC-PG (Pyrolytic Graphite) material 105 for high lateral heat spreading within the AlSiC material. The in-plane thermal conductivity value of HTC-PG is 1300 W/mK. HTC-PG 105 is preferably a rectangular sheet having a top 105A, bottom 105B, left 105C, right 105D, front 105E and rear 105F surfaces.

Figure 8:
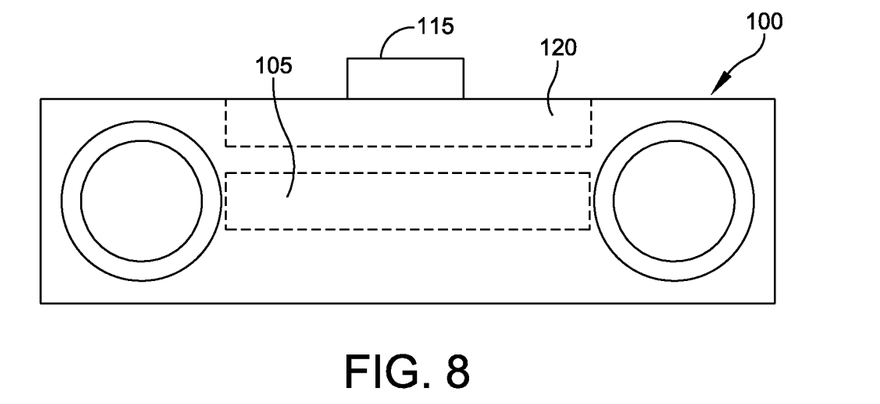
FIG. 8 illustrates the Thermal Management Device 100 of FIG. 3, showing a heat generating electronic device 115 positioned external to Thermal Management Device 100 and substrate 120 positioned internal to Thermal Management Device 100.

In one embodiment, a heat generating electronic device 115 is interfaced to a dielectric substrate 120 that is in communication with the AlSiC base 100. As illustrated in FIGS. 1 and 8, the substrate 120 is located external to base 100 and rests on its external surface.

Figure 6:
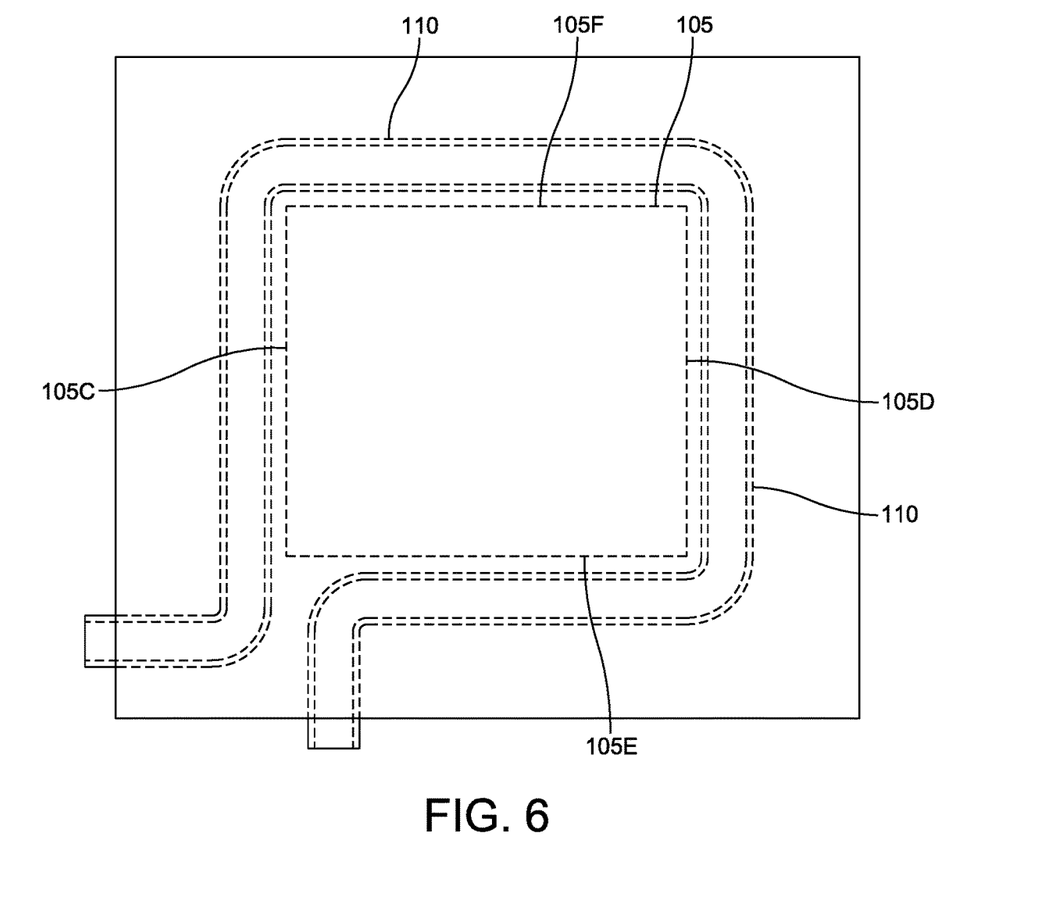
FIG. 6 illustrates a top view of an alternative embodiment Thermal Management Device 100 utilizing a single cooling channel entirely embedded in the ALSIC material.

A steel tube 110 is located within the AlSiC base 100 for the movement of a cooling liquid. As illustrated in FIG. 2 the cooling channel would have an input 110A and output 110B for the flow of coolant therein. Alternate embodiments of cooling channels 110A and 110B are illustrated in FIGS. 3-6 and 10. In one embodiment, cooling channel 110 could be laterally placed along all HTC-PG side surfaces (105C-105F), as illustrated in FIG. 6 to achieve maximum cooling efficiency.

Figure 10:
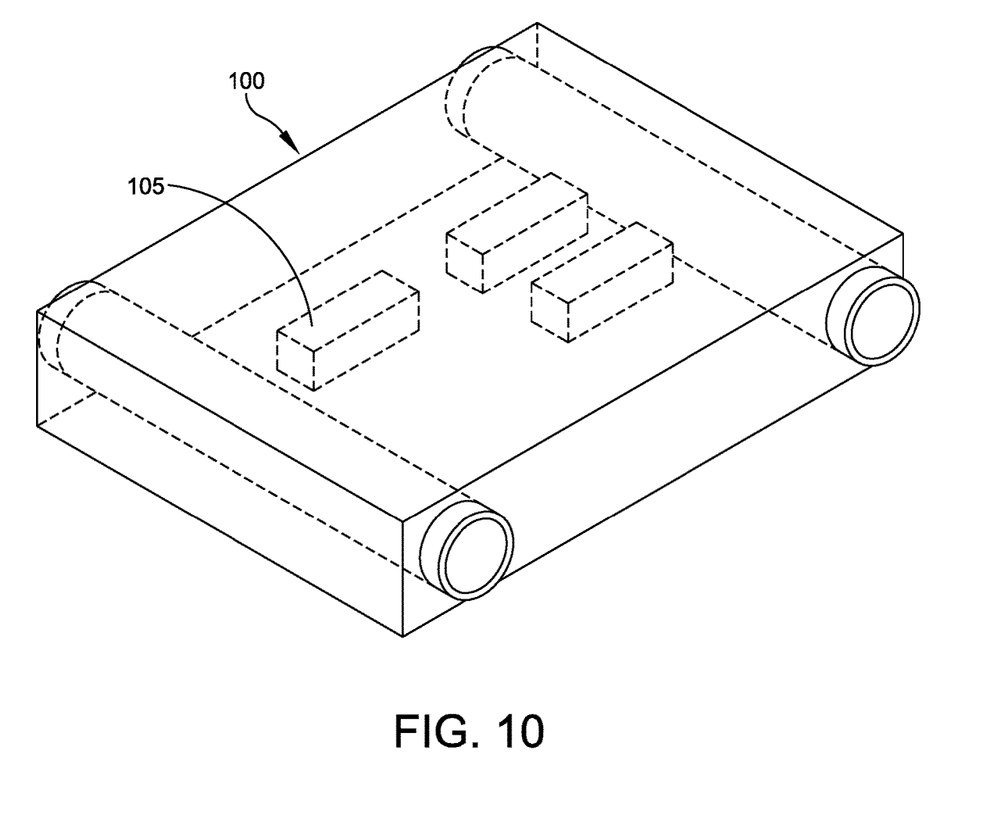
FIG. 10 illustrates a top perspective view of the Thermal Management Device 100 of FIG. 8 but utilizing a plurality of pyrolytic graphite positioned in locations that would correspond to the location of a heat generating electronic device 115 positioned thereon.

It is desirable to have HTC-PG side surfaces (105C-105F) as close to cooling channels 110 as possible to reduce thermal resistance and maximize heat transfer, even up to a point where the HTC-PG side surfaces touch cooling channels 110. Referring to FIGS. 8 and 10, an alternative embodiment would have ceramic dielectric substrate 120 embedded within the AlSiC material 100. This embodiment would further reduce thermal resistance of the dielectric interface and bring the heat generating electronic device 115 closer to the HTC/PG 105. The tubes 110 can be formed either by embedding steel tubes within a Silicon Carbide preform or including an aluminum rich area within the preform where the cooling channel will be provided by drilling the channel.

Figure 7:
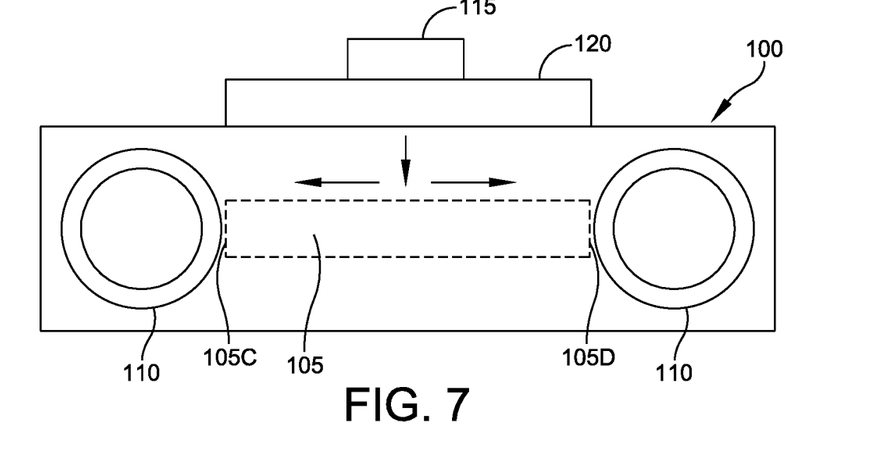
FIG. 7 illustrates the Thermal Management Device 100 of FIG. 3, showing a heat generating electronic device 115 and substrate 120 positioned external to Thermal Management Device 100.
Figure 9:
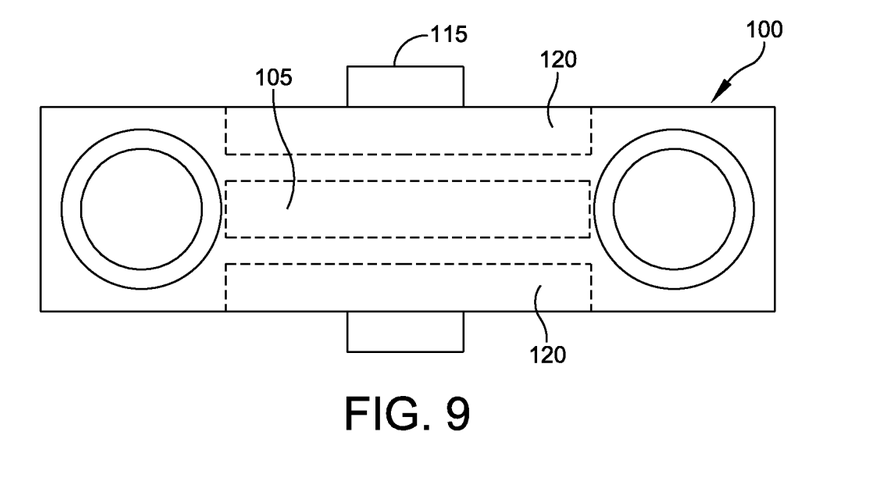
FIG. 9 illustrates the Thermal Management Device 100 of FIG. 3, showing two heat generating electronic devices 115 positioned external to Thermal Management Device 100 and two substrates 120 positioned internal to Thermal Management Device 100.

Subsequent to the infiltration process described infra, the resulting AlSiC material would include a cooling channel therein (Embedded tube) or would have to be drilled out (embedded aluminum). As illustrated in FIG. 10, the HTC-PG 105 could be located in different areas of the AlSiC base 100 to accommodate the selected placement of an electronic device 115 and dielectric substrate 120 above the HTC-PG 105. As illustrated in FIG. 7-9, it is desirable to place the heat generating device 115 in a substantially parallel relationship with the HTC-PG 105. This will maximize the transfer of heat from electronic device 115 to the HTC-PG 105. In this configuration, the lateral heat spreading characteristics of HTC-PG 105 are maximized. As illustrated in FIG. 7 (by arrows), heat will be laterally transferred to cooling channels 110, and the heat transfer will be more efficient where tubes 110 are closest to side surfaces 105C and 105D of HTC-PG 105, due to the thermal resistance being reduced. As illustrated in FIG. 9, double sided cooling can also be accomplished where the device 115 and substrate 120 are located on both sides of the HTC-PG 105.

The invention utilizes the liquid metal infiltration process as described in U.S. Pat. No. 3,547,180, and incorporates subject patent for all that it discloses. In practice, a Silicon Carbide (SiC) preform would include cooling channels and an embedded HTC-PG 105, and in the case of an embedded substrate 120, an embedded substrate.

The Al infiltration process causes aluminum to penetrate throughout the overall structure and into any surface open porosity of HTC-PG 105, and into the fraction of void volume of the SiC preform and dielectric 120 (if embedded). The material layers become bonded metallurgically and mechanically subsequent to metal infiltration casting.

Figure 11:
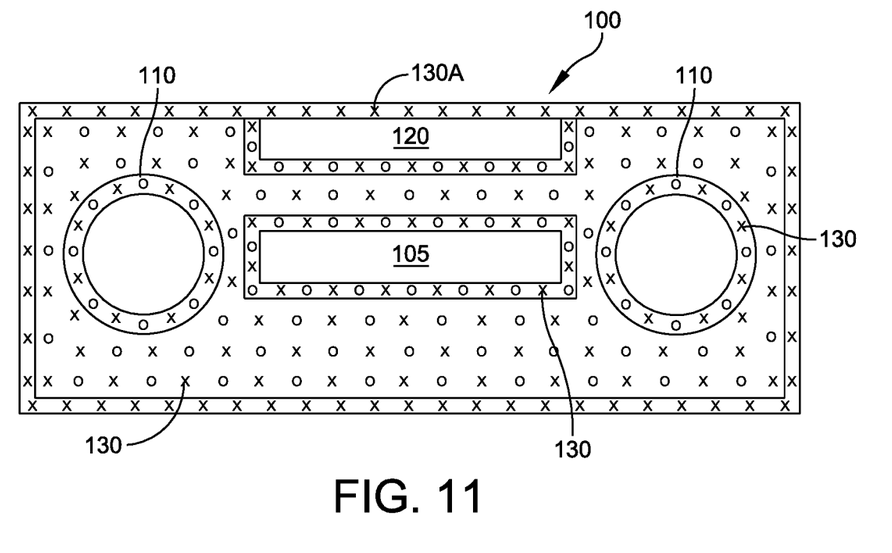
FIG. 11 illustrates the internal composition of Thermal Management Device 100 subsequent to metal infiltration of the Silicon Carbide (SiC) preform containing the pyrolytic graphite 105 and cooling channel 110.

The Al infiltrant solidifies within and around the material layers extending from one layer interface to the next, thus binding the layers together and integrating the structure. While molten aluminum is the embodiment illustrated other suitable metal infiltrants include but are not limited to aluminum alloys, copper, titanium and magnesium, and other metal alloys cast from the molten liquid phase. As illustrated in FIG. 11, subsequent to molten metal infiltration, an aluminum 130A skin 130 forms around ALSiC base 100, penetrates the interior open porosity of AlSIC base 100, and penetrates at the surface of dielectric 120, HTC-PG 105, and tube insert. In FIG. 12, open porosity is designated as "o" while metal infiltrant is designated by "X".

The HTC-PG 105 is put in compressive stress where the fabrication is done at high temperature, above the melt temperature of aluminum and the coefficient of thermal expansion (CTE) of the ALSiC is greater than the CTE of the HTC-PG 105. It is desirable that the coefficient of thermal expansion of AlSiC base 100 substantially equal that of the heat generating device 115. The magnitude of the compressive stress will be proportional to the differences in CTE between the HTC-PG 105 and AlSiC and in the relative thicknesses and moduli.

I claim:

1. A system for cooling at least one high power, heat generating device, comprising:
    a metal matrix composite having a coefficient of thermal expansion substantially equal to that of said at least one high power, heat generating device, said metal matrix composite having an interior volume, a top external surface, and a bottom external surface;
    a cooling channel positioned within said interior volume of said metal matrix composite, the cooling channel having an inlet and outlet and connected to a liquid source, said coolant channel confining a flow of a liquid within said metal matrix composite;
    at least one Pyrolytic Graphite insert positioned within said interior volume of said metal matrix composite, said at least one Pyrolytic Graphite insert having a surface area bound by a plurality of peripheral edges;
    at least one of said plurality of peripheral edges of said at least one Pyrolytic Graphite insert laterally positioned in close proximity to said cooling channel; and
    at least one of said at least one high power, heat generating device positioned on said top external surface of said metal matrix composite in a substantially parallel relationship with said surface area of said at least one Pyrolytic Graphite insert, wherein said at least one high power, heat generating device positioned on said top external surface of said metal matrix composite further includes a substrate positioned between said at least one of said at least one high power, heat generating device and said at least one Pyrolytic Graphite insert, wherein said substrate is positioned within said interior volume of said metal matrix composite, said substrate having a top surface coplanar to said top external surface of said metal matrix composite.

2. The system for cooling said at least one high power, heat generating device as in claim 1, wherein an in-plane thermal conductivity value of HTC-PG of said at least one Pyrolytic Graphite insert is at least 1300 W/mK.

3. The system for said at least one high power, heat generating device as in claim 1, wherein said coolant channel comprises steel tubes.

4. The system for cooling said at least one high power, heat generating device as in claim 1, further including at least another of said at least one high power, heat generating device positioned on said bottom external surface of said metal matrix composite in the substantially parallel relationship with said surface area of said at least one Pyrolytic Graphite insert.

* * * * *